United States Patent
Olivadese et al.

(10) Patent No.: US 10,891,251 B2
(45) Date of Patent: Jan. 12, 2021

(54) SIGNAL CONNECTOR FOR MICROWAVE CIRCUITS

(71) Applicant: International Business Machines Corporation, Armonk, NY (US)

(72) Inventors: Salvatore Bernardo Olivadese, Stamford, CT (US); Patryk Gumann, Tarrytown, NY (US); Nicholas T. Bronn, Long Island City, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 78 days.

(21) Appl. No.: 16/186,157

(22) Filed: Nov. 9, 2018

(65) Prior Publication Data

US 2020/0151133 A1     May 14, 2020

(51) Int. Cl.
| | |
|---|---|
| *G06N 10/00* | (2019.01) |
| *G06F 13/40* | (2006.01) |
| *H01F 41/04* | (2006.01) |
| *H01L 39/02* | (2006.01) |
| *H01L 39/22* | (2006.01) |

(52) U.S. Cl.
CPC ......... *G06F 13/4068* (2013.01); *G06N 10/00* (2019.01); *H01F 41/048* (2013.01); *H01L 39/025* (2013.01); *H01L 39/223* (2013.01)

(58) Field of Classification Search
CPC ... G06F 13/4068; G06N 10/00; H01F 41/048; H01L 39/025; H01L 39/223
See application file for complete search history.

(56) References Cited

U.S. PATENT DOCUMENTS

| | | | |
|---|---|---|---|
| 6,758,059 B2 | 7/2004 | Kelly et al. | |
| 8,279,022 B2* | 10/2012 | Thom | H01R 13/46 333/168 |
| 8,441,329 B2 | 5/2013 | Thom et al. | |
| 8,464,542 B2* | 6/2013 | Hilton | F25B 9/10 62/46.1 |

(Continued)

FOREIGN PATENT DOCUMENTS

| | | |
|---|---|---|
| EP | 1474822 B1 | 7/2016 |
| WO | 002073100 A1 | 9/2002 |
| WO | 2017111949 A1 | 6/2019 |

OTHER PUBLICATIONS

Das et al., Cryogenic Integration for Quantum Computing, 2018 IEEE 68th Electronic Components and Technology Conference, May 29, 2018, pp. 504-514.

(Continued)

*Primary Examiner* — Brian T Misiura
(74) *Attorney, Agent, or Firm* — Garg Law Firm, PLLC; Rakesh Garg; Keivan Razavi

(57) ABSTRACT

In an embodiment, a device includes a first high density interface in a first dilution fridge stage configured to receive a first set of transmission lines. In an embodiment, a device includes a second high density interface in a second dilution fridge stage configured to receive a second set of transmission lines. In an embodiment, a device includes a printed circuit board configured to transfer microwave signals between a first dilution fridge stage and the second dilution fridge stage, the first high density interface and the second high density interface coupled to the printed circuit board.

20 Claims, 5 Drawing Sheets

(56) References Cited

U.S. PATENT DOCUMENTS

| | | | |
|---|---|---|---|
| 10,319,896 B2* | 6/2019 | Falcon | H01L 39/223 |
| 10,565,515 B2* | 2/2020 | Lampert | H01L 23/34 |
| 10,586,909 B2* | 3/2020 | Das | H01L 24/06 |
| 2010/0221960 A1 | 9/2010 | Chung | |
| 2014/0137571 A1* | 5/2014 | Petroff | B01D 8/00 62/6 |
| 2016/0292587 A1 | 10/2016 | Rigetti et al. | |
| 2017/0177534 A1 | 6/2017 | Mohseni et al. | |
| 2017/0373658 A1 | 12/2017 | Thom et al. | |
| 2018/0102470 A1 | 4/2018 | Das et al. | |

OTHER PUBLICATIONS

Sejas-Garcia et al., Impact of the Configuration of Ground Vias on the Performance of Vertical Transitions Used in Electronic Packages, 2009 IEEE MTT-S International Microwave Workshop Series on Signal Integrity and High-Speed Interconnects (IMWS2009-R9), Feb. 19, 2009, pp. 17-20.

PCT, International Searching Authority, PCT/EP2019/079643, dated Jan. 15, 2020.

List of all IBM's related Dockets, Appendix P, 2020.

R.E. George et al., Multiplexing Superconducting Qubit Circuit for Single Microwave Photon Generation, Jul. 5, 2017.

* cited by examiner

SIGNAL CONNECTOR FOR MICROWAVE CIRCUITS

TECHNICAL FIELD

The present invention relates generally to a device, a circuit design method, and a circuit construction system for signal connectors. More particularly, the present invention relates to a device, method, and system for a signal connector for microwave circuits operating in a cryogenic temperature range.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits (q-circuits), e.g., the qubits themselves, the readout circuitry associated with the qubits, and other parts of the quantum processor, must not alter the energy states of the qubit, such as by injecting or dissipating energy in any significant manner, or influence the relative phase between the |0> and |1> states of the qubit. This operational constraint on any circuit that operates with quantum information necessitates special considerations in fabricating semiconductor and superconducting structures that are used in such circuits.

The presently available superconducting quantum circuits are formed using materials that become superconducting at cryogenically low temperatures, e.g., at about 10-100 millikelvin (mK), or about 4 K. The electronic circuits that are used to control, operate, and measure the quantum circuits are usually located outside the dilution fridge that houses the superconducting quantum circuit. The temperature outside the fridge is usually about 300 K (room temperature).

The presently available superconducting quantum circuits usually operate in the microwave frequency range. Microwave signals/pulses are used to initialize, manipulate, control, and measure the superconducting qubits within the superconducting q-circuits. To communicate these microwave signals between the external electronic circuits outside the fridge and the superconducting quantum circuits inside the fridge, microwave transmission lines are used inside the dilution fridge. Coaxial lines are one example of transmission lines that can carry these microwave signals.

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge.

Transition plates formed of a thermally insulating material separate dilution fridge stages. To maintain the temperature difference between the different stages inside the fridge, it is common practice to use lossy transmission lines to connect between two consecutive stages. The illustrative embodiments recognize that each qubit requires at least one corresponding transmission line in each dilution fridge stage in order to measure the state of the corresponding qubit. In general, transition plates serve multiple purposes: they provide thermal isolation between the stages, they provide connection points for Line-of-Sight (LOS) ports for the transmission lines between two consecutive stages. A LOS port is a port formed in the transition plate which allows connections between transmission lines in adjacent dilution fridge stages. The presently available LOS ports are generally seven centimeters by seven centimeters square ports or seven centimeter diameter ports in the transmission plate. Presently available transition plates have as many as nine LOS ports, each port allowing 50-300 connections for transmission lines.

High density interfaces provide a grid array of connection points or pins configured to receive numerous transmission lines. For example, a single high density interface can be configured to receive at least ten transmission lines. High density interfaces provide shielding to prevent crosstalk between adjacent lines.

The illustrative embodiments recognize that commercially available signal connectors bottleneck at LOS ports. For example, in most cases, the transmission lines transition from one dilution fridge stage to the next dilution fridge stage through the LOS ports. The illustrative embodiments recognize that the size and the number of LOS ports limit the space available for transmission line connections.

As the number of qubits increases, so does the number of transmission lines and, therefore, the number and size of LOS ports must also increase to accommodate signal connections between adjacent dilution fridge stages. The illustrative embodiments recognize that the size of the dilution fridge limits the number and size of the LOS ports. However, increasing the size of the dilution fridge increases material and energy costs. Conversely, accommodating an increased number of LOS ports in the same available area and arrangement on the transition plate leads to reduced separation and therefore increased cross-talk between adjacent lines. The illustrative embodiments recognize that increasing the number of transmission line connections at each LOS port using currently available LOS dimensions and transition plate dimensions represents a demonstrated need.

SUMMARY

The illustrative embodiments provide a signal connector device, a circuit design method, and system for constructing a signal connector circuit. In an embodiment, a device includes a first high density interface in a first dilution fridge stage configured to receive a first set of transmission lines. In an embodiment, a device includes a second high density interface in a second dilution fridge stage configured to receive a second set of transmission lines. In an embodiment, a device includes a printed circuit board configured to transfer microwave signals between a first dilution fridge stage and the second dilution fridge stage, the first high density interface and the second high density interface coupled to the printed circuit board.

In an embodiment, the device includes a second printed circuit board configured to transfer microwave signals between the first dilution fridge stage and the second dilution fridge stage. In an embodiment, the second printed circuit board is coupled to the printed circuit board.

In an embodiment, the printed circuit board further includes a set of vias configured to carry microwave signals, the set of vias having a length about one tenth of a wavelength of a corresponding microwave signal. In an embodiment, the set of vias are configured to carry microwave signals between the first high density interface and the second high density interface.

In an embodiment, the device includes a set of ground vias, each ground via spaced apart on the printed circuit board from each signal via by a length of about a wavelength of a corresponding microwave signal. In an embodiment, the first set of transmission lines is twenty transmission lines.

In an embodiment, the printed circuit board comprises alternating dielectric layers and conducting layers. In an embodiment, the printed circuit board is configured to be disposed in a line-of-sight port of a dilution fridge.

An embodiment includes a fabrication method for fabricating the device.

An embodiment includes a fabrication system for fabricating the device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
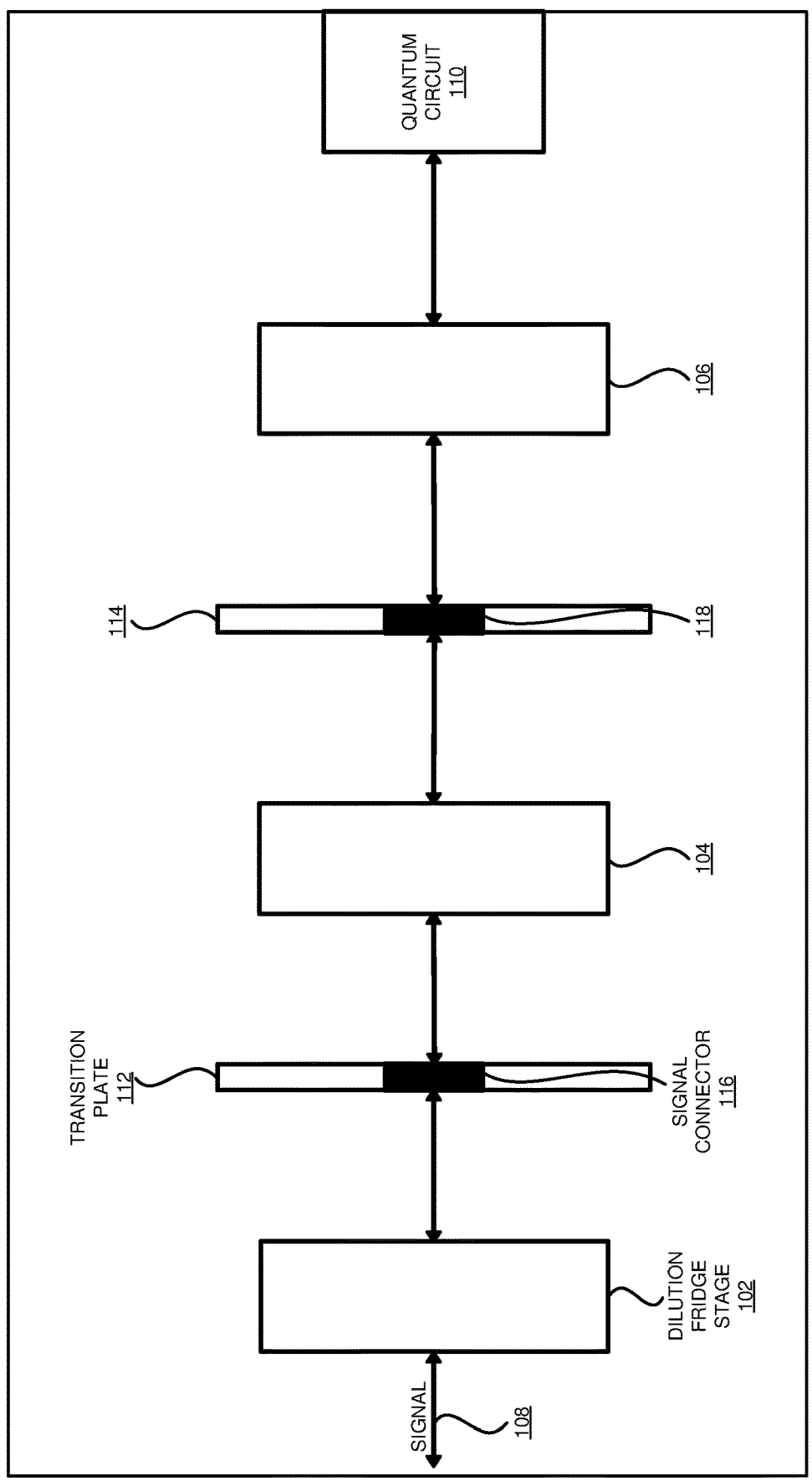
FIG. 1 depicts a block diagram of an example configuration of an input line conditioning for quantum computing devices in accordance with an illustrative embodiment.

The illustrative embodiments used to describe the invention generally address and solve the above-described needs for connecting signal lines across dilution stages. The illustrative embodiments provide signal connectors for microwave circuits, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of a signal connector for microwave circuits. Another embodiment provides a design/construction method for the signal connector, such that the method can be implemented as a software application. The application implementing a design/construction method embodiment can be configured to operate in conjunction with an existing circuit manufacturing system—such as a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example dilution fridge stages, transmission lines, connectors, and other circuit components are used in the figures and the illustrative embodiments. In an actual circuit, additional structures or components that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a signal connector for microwave circuits, and such adaptations are contemplated within the scope of the illustrative embodiments.

The illustrative embodiments are described with respect to certain types of materials, electrical properties, steps, sizes, arrangements, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of an input line conditioning for quantum computing devices in accordance with an illustrative embodiment. The depicted configuration comprises a set of one or more dilution fridge stages 102, 104, . . . 106. Input line 108 connects an external circuit to quantum circuit 110. Line 108 carries a microwave signal to quantum circuit 110 that is to be transferred across one or more dilution fridge stages.

Transition plates 112, 114 separate adjacent dilution fridge stages. For example, transition plate 112 separates stages 102, 104. Transition plate 112 is configured to thermally isolate stage 102 and stage 104. Transition plate 112 includes at least one LOS port formed therethrough. Transition plate 114 separates stages 104, 106. Transition plate 114 is configured to thermally isolate stage 104 and stage 106. Transition plate 114 includes at least one LOS port formed therethrough.

One embodiment configures a signal connector with some but not all of transition plates 112, 114. Another embodiment configures a signal connector with each of transition plates 112, 114, as shown in FIG. 1. For example, signal connector 116 is configured to operate with transition plate 112 between stages 102, 104. Signal connector 116 transfers signals between stages 102, 104. Signal connector 118 is configured to operate with transition plate 114 between stages 104, 106. Signal connector 116 transfers signals between stages 104, 106.

Figure 2:
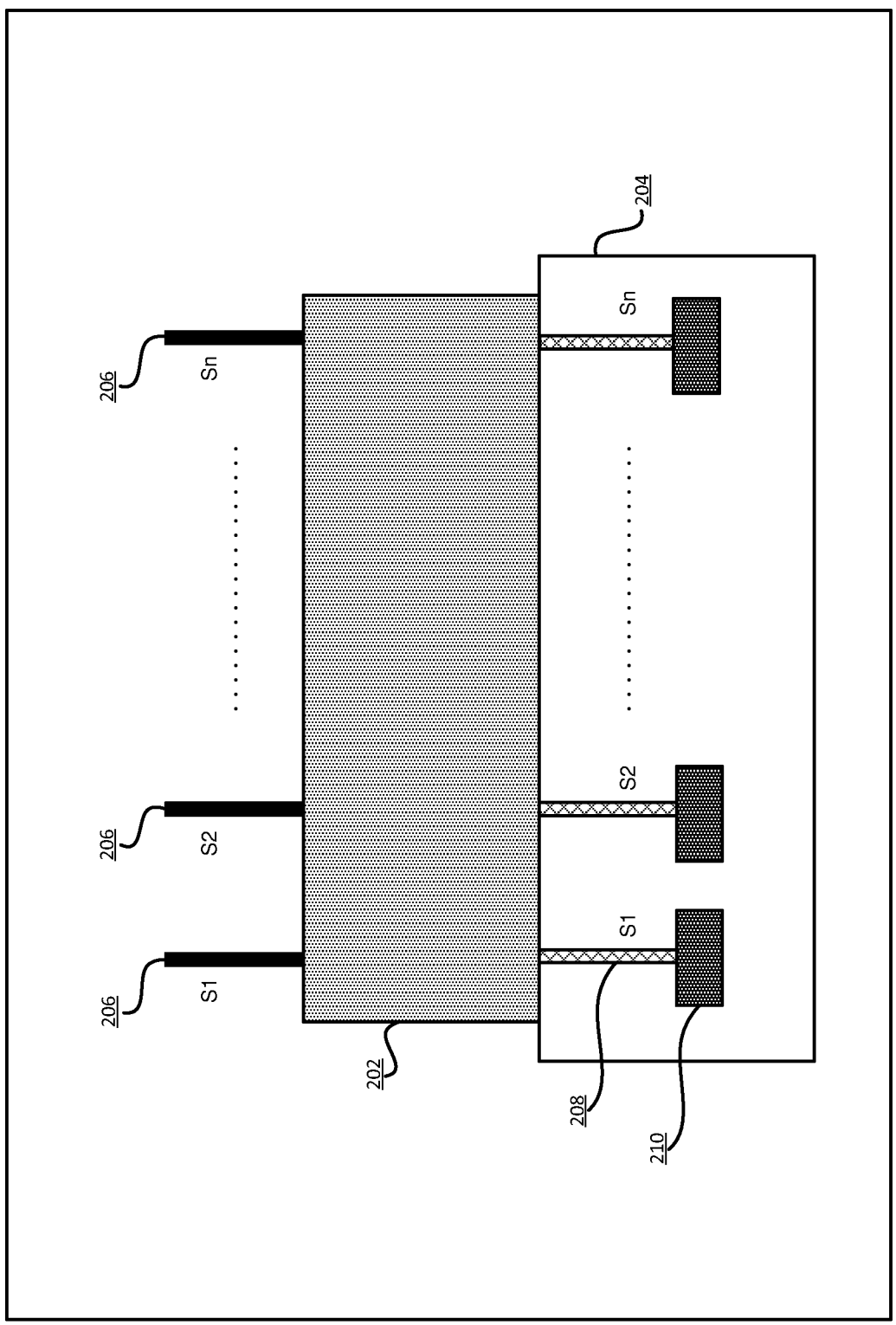
FIG. 2 depicts a cross-sectional view of one example configuration of a signal connector in accordance with an illustrative embodiment.

With reference to FIG. 2, this figure depicts a cross-sectional view of one example configuration of a signal connector in accordance with an illustrative embodiment. The example configuration in this figure, a signal connector, comprises high density interface 202 and printed circuit board 204. Transmission lines 206 connect to high density interface 202. Transmission lines 206 carry microwave signals S1, S2, . . . Sn that are to be transferred across one or more dilution fridge stages. High density interface 202 is a standard microwave connector. High density interface 202 is mounted on printed circuit board 204. Vias 208 couple to the central conductor 210 of the printed circuit board 204. Vias 208 carry microwave signals S1, S2, . . . Sn between the high density interface 202 and the central conductor of the printed circuit board. According to one embodiment, a circuit assembly system forms and connects the components on the same chip or printed circuit board.

Figure 3:
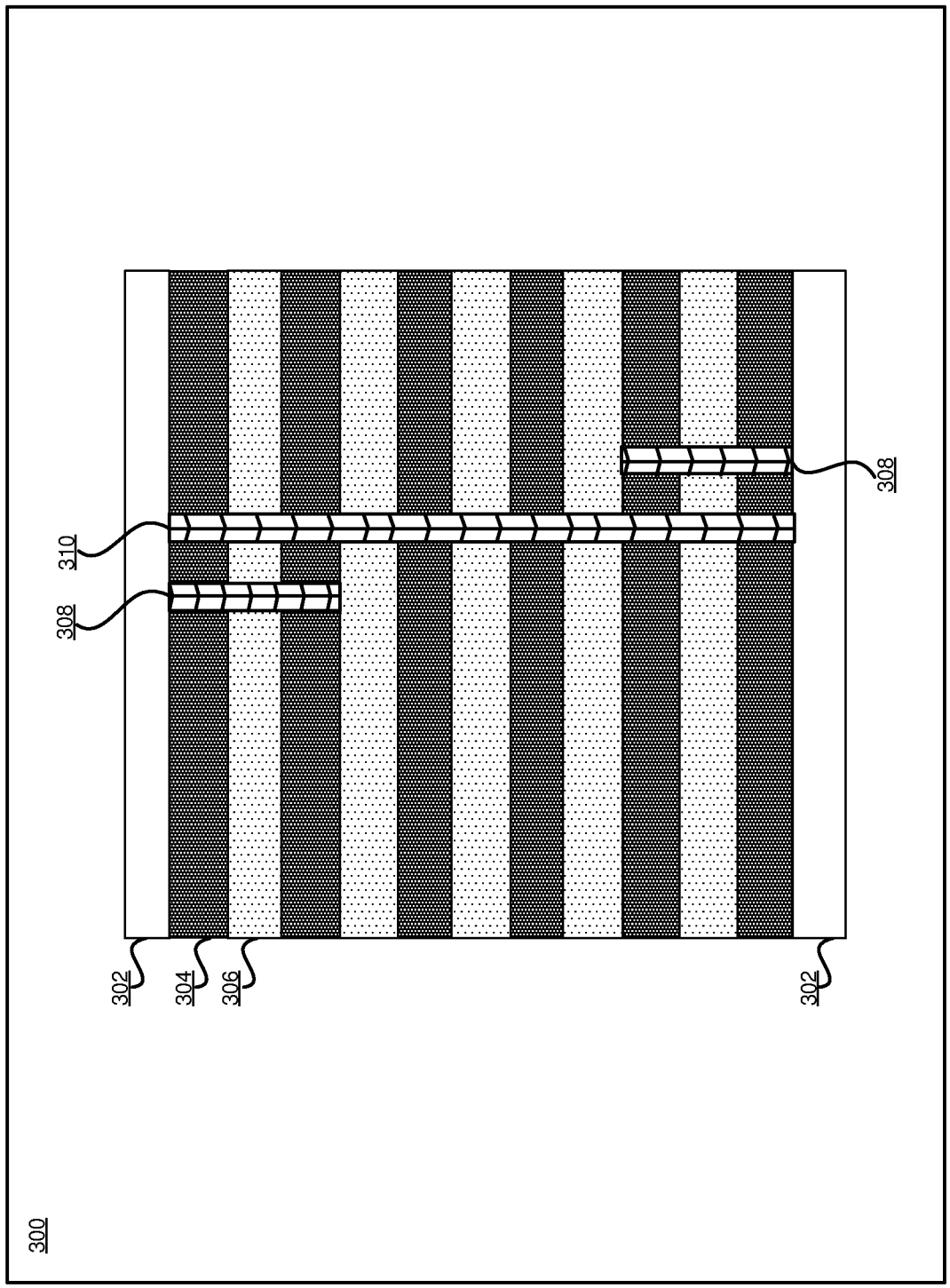
FIG. 3 depicts an example printed circuit board of an example configuration of a signal connector in accordance with an illustrative embodiment.

With reference to FIG. 3, this figure depicts an example printed circuit board 300 of an example configuration of a signal connector in accordance with an illustrative embodiment. PCB 300 is formed of alternating conductor layers 304 and dielectric layers 306 between surface layers 302. In an embodiment, conductor layers 304 comprises a material which exhibits conductive properties in a cryogenic temperature range, 77 K to 0.01 K. In an embodiment, conductor layers 304 comprises a material which exhibits superconductive properties in a cryogenic temperature range, 77 K to 0.01 K. In an embodiment, vias 308 extend through at least one conductor layer and at least one dielectric layer. Vias 308 connect to a central conductor of the printed circuit board and carry microwave signals. Vias 308 include a height less than about one tenth of a wavelength of the corresponding microwave signal. Central via 310 establishes the same electric potential along all the layers of the printed circuit board. In an embodiment, printed circuit board 300 is configured to exhibit low cross-talk (below a threshold) between signal vias 308. For example, printed circuit board can be configured to exhibit less than fifty decibels of cross-talk between adjacent signal vias 308.

Figure 4:
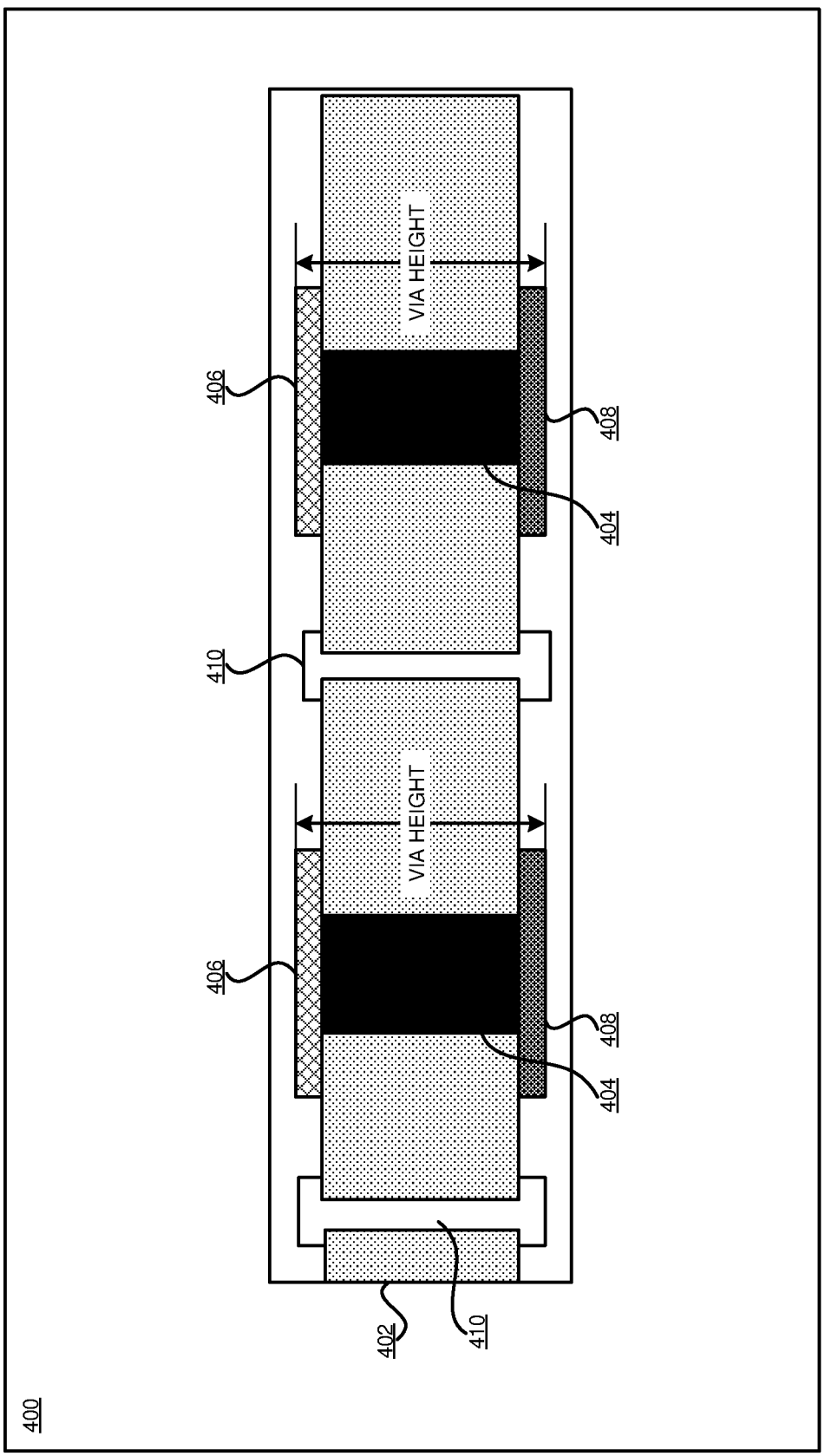
FIG. 4 depicts an example printed circuit board of an example configuration of a signal connector in accordance with an illustrative embodiment.

With reference to FIG. 4, this figure depicts an example printed circuit board of an example configuration of a signal connector in accordance with an illustrative embodiment. PCB 402 includes signal vias 404, connector pads 406, 408, and ground vias 410. Signal vias 404 carry microwave signals between connector pads 406, 408. Signal vias 404 extend a height less than about one tenth of a wavelength of the carried microwave signal. Ground vias 410 maintain the electrical potential of the printed circuit board. Pads 406 connect transmission lines from a high density interface to signal vias 404.

Figure 5:
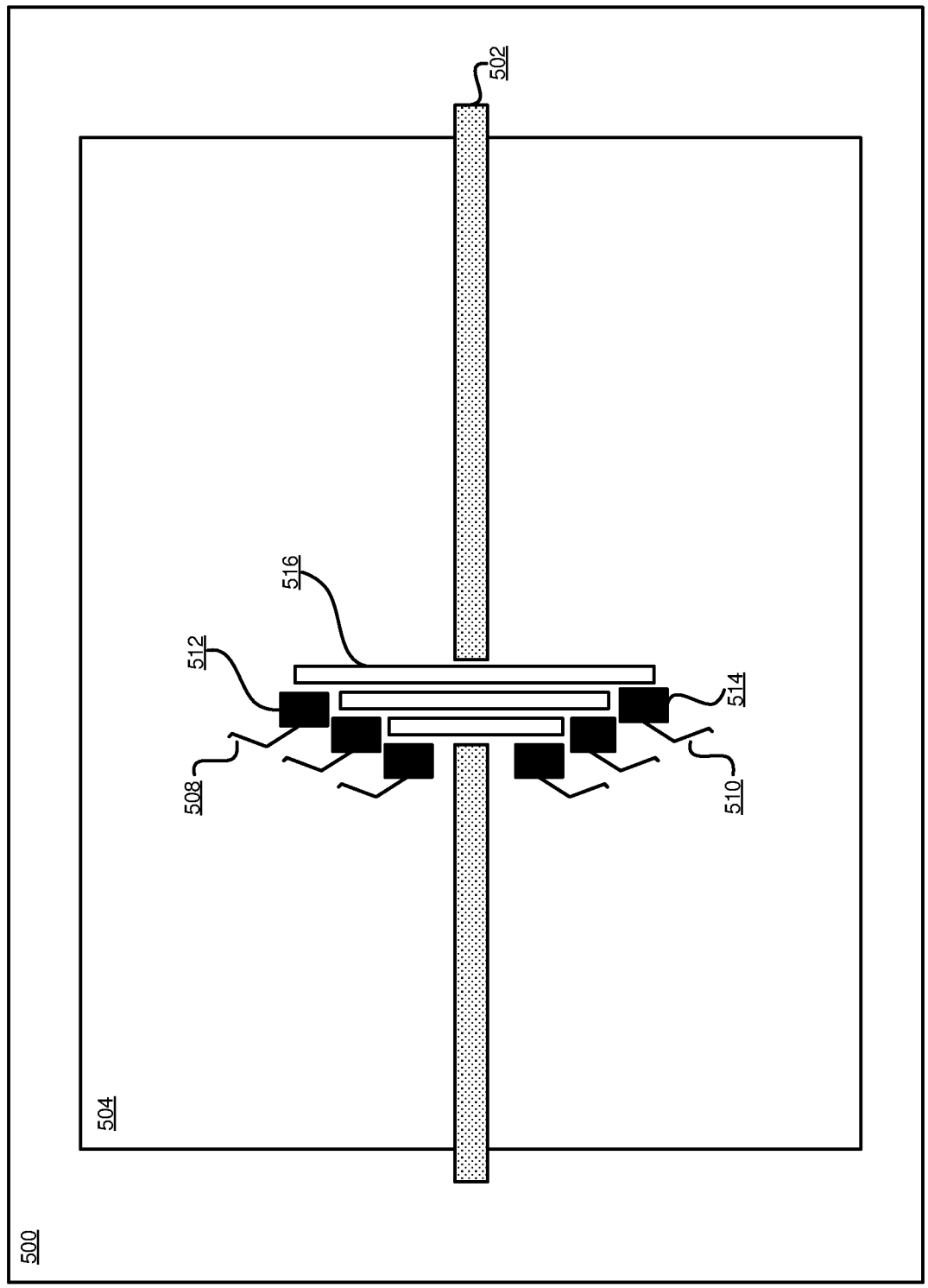
FIG. 5 depicts an example configuration of a signal connector in accordance with an illustrative embodiment.

With reference to FIG. 5, this figure depicts an example configuration of a signal connector in accordance with an illustrative embodiment. The example configuration in this figure, signal connector 500, comprises a first set of transmission lines 508, a second set of transmission lines 510, high density interfaces 512, 514, and printed circuit board 516. Transition plate 502 separates stages 504, 506. Transition plate 502 is configured to thermally isolate stage 504 and stage 506. Transition plate 502 includes at least one LOS port formed therethrough.

The first set of transmission lines 508 connects to high density interface 512. The first set of transmission lines 508 is configured to carry microwave signals to be transferred across one or more dilution fridge stages. The first set of transmission lines 508 is configured to carry microwave signals transferred across transition plate 502 between stages 504, 506. The second set of transmission lines 510 connects to high density interface 514. The second set of transmission lines 510 is configured to carry microwave signals to be transferred across one or more dilution fridge stages. The second set of transmission lines 510 is configured to carry microwave signals transferred across transition plate 502 between stages 504, 506.

High density interface 512 is configured to receive the first set of transmission lines 508. High density interface 514 is configured to receive the second set of transmission lines 510. High density interface 512 is coupled to printed circuit board 516. High density interface 512 is disposed in the first dilution fridge stage 504. High density interface 514 is coupled to printed circuit board 516. High density interface 516 is disposed in the second dilution fridge stage 506. Printed circuit board 516 receives the microwave signals from high density interfaces 512, 514 and is configured to transfer the microwave signals between stages 504, 506. In an embodiment, a signal connector comprises a set of printed circuit boards. For example, a second printed circuit board can be mounted to the first printed circuit board. Each printed circuit board of the set of printed circuit boards is configured to receive respective transmission lines at respective high density interfaces.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A signal connector for microwave circuits, comprising:
   a first high density interface in a first dilution fridge stage configured to receive a first set of transmission lines;
   a second high density interface in a second dilution fridge stage configured to receive a second set of transmission lines; and
   a printed circuit board configured to transfer microwave signals between the first dilution fridge stage and the second dilution fridge stage, the first high density interface and the second high density interface directly coupled to the printed circuit board.

2. The signal connector of claim 1, further comprising:
   a second printed circuit board configured to transfer microwave signals between the first dilution fridge stage and the second dilution fridge stage.

3. The signal connector of claim 2, wherein the second printed circuit board is coupled to the printed circuit board.

4. The signal connector of claim 1, the printed circuit board further comprising:

a set of vias configured to carry microwave signals, the set of vias having a length about one tenth of a wavelength of a corresponding microwave signal.

5. The signal connector of claim 4, wherein the set of vias are configured to carry microwave signals between the first high density interface and the second high density interface.

6. The signal connector of claim 4, the printed circuit board further comprising:
a set of ground vias, each ground via spaced apart on the printed circuit board from each signal via by a length of about a wavelength of a corresponding microwave signal.

7. The signal connector of claim 1, wherein the first set of transmission lines is twenty transmission lines.

8. The signal connector of claim 1, wherein the printed circuit board comprises alternating dielectric layers and conducting layers.

9. The signal connector of claim 1, wherein the printed circuit board is configured to be disposed in a line-of-sight port of a dilution fridge.

10. A method comprising:
connecting a first set of transmission lines to a first high density interface, the first high density interface in a first dilution fridge stage;
connecting a second set of transmission lines to a second high density interface, the second high density interface in a second dilution fridge stage; and
transferring a set of microwave signals between the first dilution fridge stage and the second dilution fridge stage on a printed circuit board, the first high density interface and the second high density interface directly coupled to the printed circuit board.

11. The method of claim 10, further comprising:
transferring a second set of microwave signals between the first dilution fridge stage and the second dilution fridge stage on a second printed circuit board.

12. The method of claim 11, wherein the second printed circuit board is coupled to the printed circuit board.

13. The method of claim 10, wherein the printed circuit board further comprises:

a set of vias configured to carry microwave signals, the set of vias having a length about one tenth of a wavelength of a corresponding microwave signal.

14. The method of claim 13, wherein the set of vias are configured to carry microwave signals between the first high density interface and the second high density interface.

15. The method of claim 13, wherein the printed circuit board further comprises:
a set of ground vias, each ground via spaced apart on the printed circuit board from each signal via by a length of about a wavelength of a corresponding microwave signal.

16. The method of claim 10, wherein the first set of transmission lines is twenty transmission lines.

17. A circuit assembly system performing operations comprising:
connecting a first set of transmission lines to a first high density interface, the first high density interface in a first dilution fridge stage;
connecting a second set of transmission lines to a second high density interface, the second high density interface in a second dilution fridge stage; and
transferring a set of microwave signals between the first dilution fridge stage and the second dilution fridge stage on a printed circuit board, the first high density interface and the second high density interface directly coupled to the printed circuit board.

18. The system of claim 17, the operations further comprising:
transferring a second set of microwave signals between the first dilution fridge stage and the second dilution fridge stage on a second printed circuit board.

19. The system of claim 18, wherein the second printed circuit board is mounted to the printed circuit board.

20. The system of claim 17, wherein the printed circuit board further comprises:
a set of vias configured to carry microwave signals, the set of vias having a length about one tenth of a wavelength of a corresponding microwave signal.

\* \* \* \* \*